United States Patent
Dong

(10) Patent No.: US 10,607,881 B2
(45) Date of Patent: Mar. 31, 2020

(54) DEVICE ISOLATION STRUCTURE AND METHODS OF MANUFACTURING THEREOF

(71) Applicant: GLOBALFOUNDRIES Singapore Pte. Ltd., Singapore (SG)

(72) Inventor: Ke Dong, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 63 days.

(21) Appl. No.: 15/726,405

(22) Filed: Oct. 6, 2017

(65) Prior Publication Data

US 2019/0109039 A1 Apr. 11, 2019

(51) Int. Cl.
| | |
|---|---|
| *H01L 21/70* | (2006.01) |
| *H01L 21/762* | (2006.01) |
| *H01L 21/8238* | (2006.01) |
| *H01L 27/092* | (2006.01) |
| *H01L 29/78* | (2006.01) |
| *H01L 29/40* | (2006.01) |
| *H01L 29/10* | (2006.01) |
| *H01L 29/06* | (2006.01) |
| *H01L 29/417* | (2006.01) |

(52) U.S. Cl.
CPC .... *H01L 21/7621* (2013.01); *H01L 21/76224* (2013.01); *H01L 21/823878* (2013.01); *H01L 27/092* (2013.01); *H01L 29/407* (2013.01); *H01L 29/7816* (2013.01); *H01L 29/0649* (2013.01); *H01L 29/1083* (2013.01); *H01L 29/4175* (2013.01); *H01L 29/7835* (2013.01)

(58) Field of Classification Search
CPC ........... H01L 21/7621; H01L 21/76898; H01L 21/823878; H01L 22/14; H01L 27/092; H01L 29/0649; H01L 29/1083; H01L 29/407; H01L 29/7816
USPC .......................... 438/424, 622; 257/338, 506
See application file for complete search history.

(56) References Cited

U.S. PATENT DOCUMENTS

| | | | | |
|---|---|---|---|---|
| 4,786,960 A | * | 11/1988 | Jeuch | H01L 21/743 257/374 |
| 4,994,406 A | * | 2/1991 | Vasquez | H01L 21/76202 257/E21.552 |
| 2013/0187159 A1 | * | 7/2013 | Helm | H01L 23/535 257/52 |
| 2013/0285694 A1 | * | 10/2013 | Graves-Abe | H01L 22/14 324/762.01 |

* cited by examiner

*Primary Examiner* — Brook Kebede
(74) *Attorney, Agent, or Firm* — Thompson Hine LLP

(57) ABSTRACT

Semiconductor devices and methods of forming thereof are disclosed. A substrate with different device regions defined in the substrate is provided. A deep trench isolation (DTI) structure is formed in the substrate to isolate the different device regions. The DTI structure includes a fill material and a dielectric layer surrounding the fill material in the DTI structure. Local oxidation of the substrate is performed over the DTI structure to form a thermal dielectric layer which overlaps the DTI structure. The thermal dielectric layer which overlaps the DTI structure forms a thick top corner dielectric in the DTI structure.

5 Claims, 11 Drawing Sheets

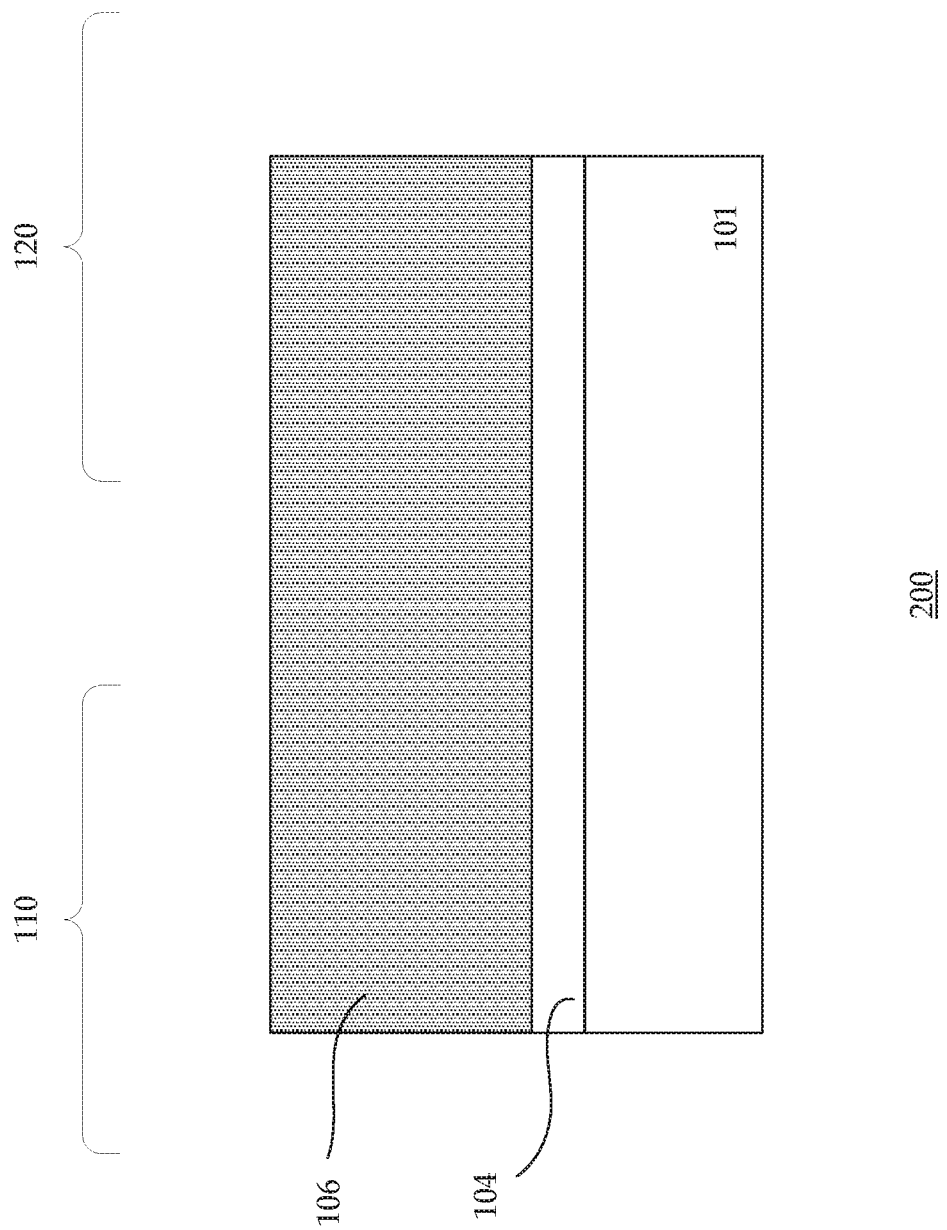

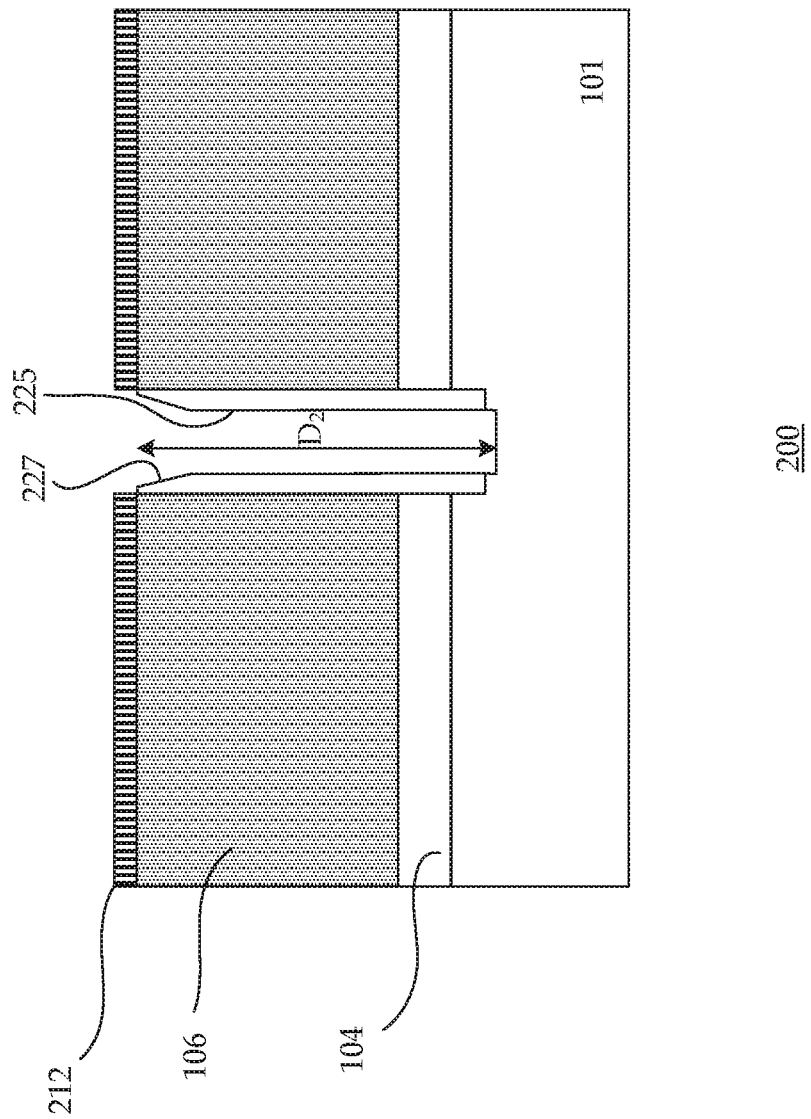

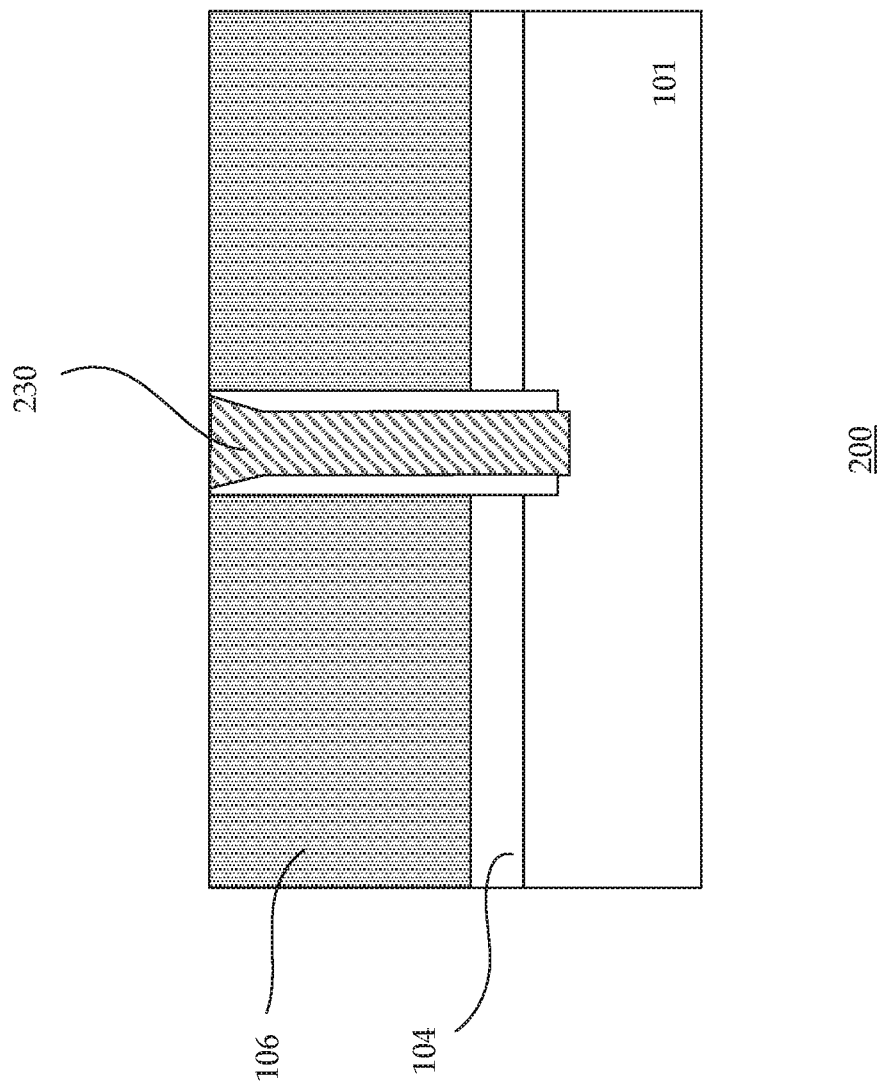

DEVICE ISOLATION STRUCTURE AND METHODS OF MANUFACTURING THEREOF

BACKGROUND

A single chip or integrated circuit (IC) includes various components such as memory array, high voltage (HV) devices and high speed logic circuit elements. Integration of these different types of devices in a single die or chip involves a number of considerations such as, for example, interference which is prone to occur between the different devices. For example, high voltage devices may have latch up problem. This may undesirably affect the reliability of the overall product during integration. As such, there is a need to properly isolate the different types of devices from each other during integration. Conventional isolation techniques used for isolating the different types of devices poses potential breakdown voltage (BV) and reliability issues.

From the foregoing discussion, it is desirable to provide reliable and optimized isolation structures to effectively isolate various devices in the same IC.

SUMMARY

Embodiments generally relate to semiconductor device isolation and methods of forming thereof. In one embodiment, a method for forming a device is disclosed. A substrate with different device regions defined in the substrate is provided. A deep trench isolation (DTI) structure is formed in the substrate to isolate the different device regions. The DTI structure includes a fill material and a dielectric layer surrounding the fill material in the DTI structure. Local oxidation of the substrate is performed over the DTI structure to form a thermal dielectric layer which overlaps the DTI structure. The thermal dielectric layer which overlaps the DTI structure forms a thick top corner dielectric in the DTI structure.

In another embodiment, a semiconductor device is disclosed. The device includes a substrate with different device regions defined in the substrate. A DTI structure is disposed in the substrate. The DTI structure extends from a top surface of the substrate to a portion of the substrate to isolate the different device regions. The DTI structure includes a fill material and a dielectric layer surrounding the fill material in the DTI structure. A thermal dielectric layer is disposed on the substrate. The thermal dielectric layer overlaps the DTI structure to provide a thick top corner dielectric in the DTI structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 2a-2j show an embodiment of a process for forming a device.

DETAILED DESCRIPTION

Embodiments generally relate to semiconductor devices or integrated circuits (ICs). More particularly, some embodiments relate to devices having high power devices integrated with other devices, such as for example, logic and memory devices, on the same substrate. For example, high power devices include lateral double-diffused metal oxide semiconductor (LDMOS) transistors. Other suitable devices may also be useful. The high power devices can be employed as switching voltage regulators for power management applications. In one embodiment, deep trench isolation (DTI) structures or regions having a thick top corner dielectric is provided to effectively isolate different devices in the same IC. For example, high power devices are isolated from other devices in the same substrate using the DTI structures. Such device isolation structures and different devices can be incorporated into ICs and easily integrated into logic processing technologies. The devices or ICs can be incorporated into or used with, for example, consumer electronic products, standalone memory devices, such as USB or other types of portable storage units, or ICs, such as microcontrollers or system on chips (SoCs) or other suitable types of products.

Figure 1:
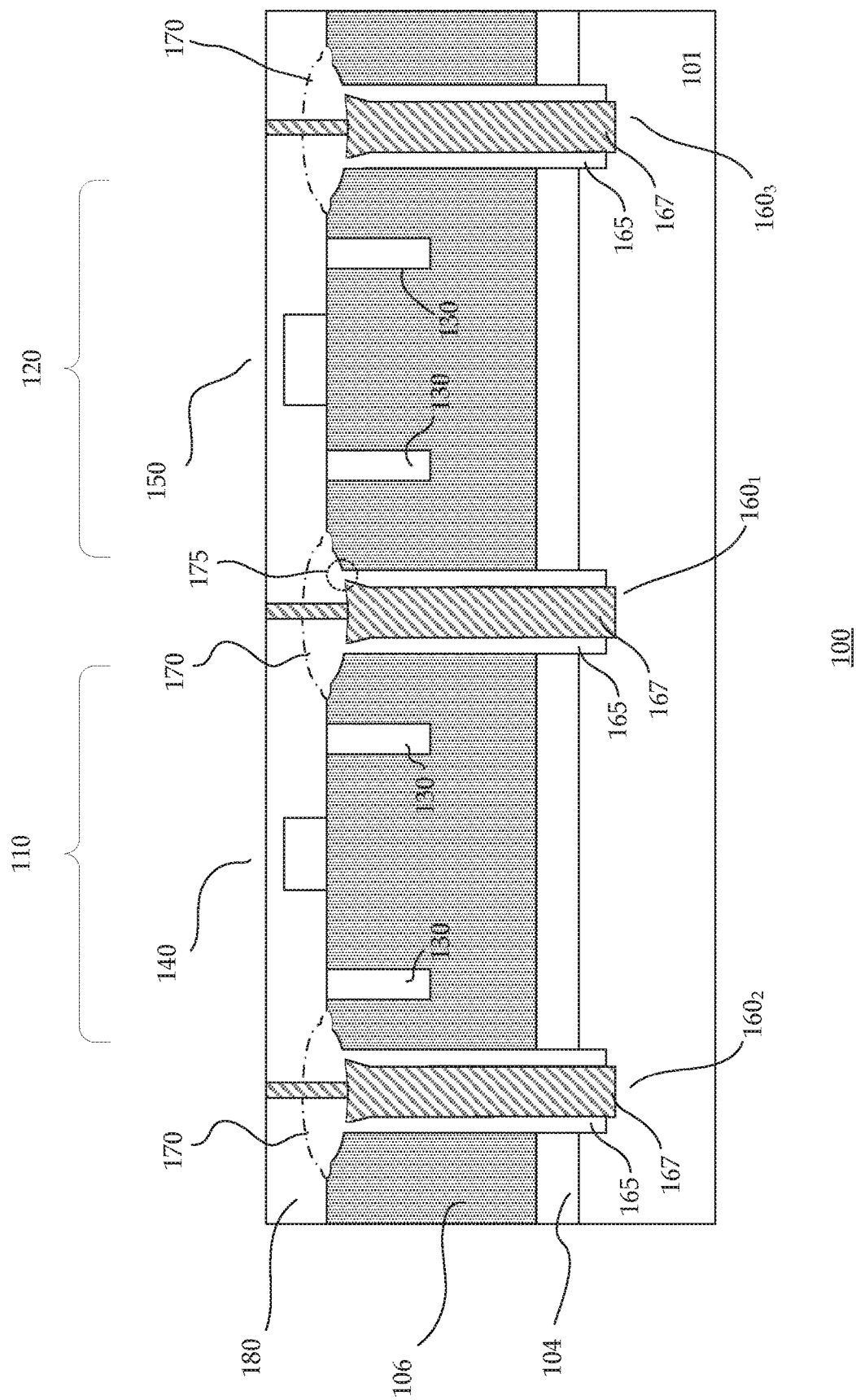
FIG. 1 shows a cross-sectional view of a portion of a device.

FIG. 1 shows a cross-sectional view of a portion of an embodiment of a device 100. The device, for example, is an IC. Other types of devices may also be useful. The device includes a substrate. As illustrated, the substrate includes a base substrate 101. The base substrate, for example, is a silicon substrate. Other suitable types of semiconductor substrates may also useful. The base substrate may be a doped substrate. For example, the base substrate can be lightly doped with first polarity type dopants. The first polarity type dopants, for example, are p-type dopants. Alternatively, the first polarity type dopants may be n-type dopants. P-type dopants may include boron (B), aluminum (Al), indium (In) or a combination thereof, while n-type dopants may include phosphorous (P), arsenic (As), antimony (Sb) or a combination thereof. The doped regions may have different dopant concentrations. For example, the device may include heavily doped ($x^+$), intermediately doped (x) and lightly doped ($x^-$) regions, where x is the polarity type which can be p or n. Providing a base substrate with other types of dopants or dopant concentrations as well as an undoped substrate, may also be useful.

In one embodiment, a buried layer 104 may be disposed in a top portion of the base substrate 101 and an epitaxial layer 106 is disposed over the buried layer. The base substrate, the buried layer and the epitaxial layer may be referred to as the substrate of the device. A top surface of the epitaxial layer may be referred to as the top surface of the substrate. The buried layer, for example, is a heavily doped region with second polarity type dopants for a first polarity type base substrate. For example, the buried layer is a n-type buried layer for a p-type base substrate. Alternatively, the buried layer is a p-type buried layer for a n-type base substrate. The buried layer, for example, is used for high voltage device isolation to the first polarity type base substrate 101.

As for the epitaxial layer, it is provided as a second polarity type epitaxial layer. For example, the epitaxial layer is a n-type epitaxial layer grown on the n-type buried layer.

Alternatively, the epitaxial layer is a p-type epitaxial layer grown on the n-type buried layer. The dopant concentration of the epitaxial layer may be higher than the dopant concentration of the base substrate. In other cases, the substrate may be a bulk semiconductor substrate such as a bulk silicon substrate.

The substrate includes different device regions. For illustration purpose, the substrate is shown to include first and second device regions 110 and 120. The first and second device regions, for example, are high voltage (HV) device regions for high voltage devices, such as HV transistors. The HV device regions, in one embodiment, accommodate HV components. Other suitable types of regions may also be included in the HV device regions. The first and second device regions, for example, include lateral double-diffused metal oxide semiconductor (LDMOS) transistors 140 and 150. For illustration purpose, a first LDMOS transistor 140 is disposed in the first device region 110 and a second LDMOS transistor 150 is disposed in the second device region. The first LDMOS transistor, in one embodiment, may be a first polarity type LDMOS transistor while the second LDMOS transistor may be a second polarity type LDMOS transistor. The first polarity type LDMOS transistor, for example, is a LDPMOS transistor while the second polarity type LDMOS transistor is a LDNMOS transistor. The first and second device regions, for example, are prepared for devices operating in high voltage ranges. Other suitable number of transistors and/or other suitable type of HV devices may be disposed in the first and second device regions.

The substrate may also include other types of device regions (not shown) for other types of circuitry, depending on the type of device or IC. In some embodiments, the substrate includes other device regions such as low voltage (LV) and/or medium voltage (MV) device regions as well as an array region for memory devices. A LV device region, for example, accommodates LV components while a MV device region accommodates MV components. For example, the LV and/or MV device regions accommodate one or more transistors. For simplicity and illustration purpose, only the high voltage device region is shown.

In some embodiments, isolation regions may be provided for isolating or separating different doped regions in the substrate. In one embodiment, the different doped regions are isolated from each other by shallow trench isolation (STI) regions 130. A STI region includes an isolation trench filled with isolation or dielectric materials. Other suitable types of isolation regions may also be employed. The STI regions, for example, extend to a depth shallower than the bottom of the epitaxial layer.

As described, the HV transistors, for example, include LDMOS transistors. Other suitable types of HV transistors may also be useful. For illustration purpose, LDMOS transistors are described herein. A LDMOS transistor includes a gate on the surface of the substrate. The gate, in one embodiment, includes a gate electrode over a gate dielectric. The gate dielectric, for example, may be silicon oxide while the gate electrode may be polysilicon. In some embodiments, the gate electrode may be a doped electrode. For example, n-type dopants may be used to dope the gate electrode of NMOS transistor while p-type dopants may be used to dope the gate electrode of PMOS transistor. Other suitable types of gate dielectrics and gate electrodes as well as thicknesses may also be useful.

The LDMOS transistors also include first and second doped regions disposed in the substrate on first and second sides of the gates (not shown). For example, the first doped region is disposed on the first side of the gate and the second doped region is disposed on the second side of the gate. For the first type LDMOS transistor, the doped regions, in one embodiment, are heavily doped with first polarity type dopants. As for the second type LDMOS transistor, the doped regions, in one embodiment, are heavily doped with second polarity type dopants. For example, the LDNMOS transistor in the first device region includes first and second doped regions which are heavily doped n-type ($n^+$) regions. As for the LDPMOS transistor in the second device region, it includes first and second doped regions which are heavily doped p-type ($p^+$) regions. In one embodiment, the first doped region of a LDMOS transistor serves as a source region while the second doped region serves as a drain region.

Sidewalls of the gate may be provided with dielectric spacers (not shown). The dielectric spacers, for example, may be silicon oxide spacers. Other suitable types of dielectric materials may also be useful, such as silicon nitride or a combination of dielectric materials or layers. For example, the spacers may be composite spacers. Other configurations of spacers may also be useful. Drift wells may be disposed in the first and second device regions. For example, the drift well is disposed between the gate and the drain region, underlapping a portion of the gate. A drift well may encompass the drain and the internal device isolation region. In one embodiment, the depth or bottom of the drift well is below the drain region. In one embodiment, the depth or bottom of the drift well is below the STI and internal device isolation regions. In one embodiment, the drift well is contiguous and encompasses the drain region and at least overlaps a portion of the active region underneath the gate.

Additionally, device or transistor wells may be disposed in the first and second device regions. A device well, for example, serves as a body for a LDMOS transistor. The device well may be lightly ($x^-$) or intermediately (x) doped with opposite polarity type of dopants than that of the type of the transistor. The device well, for example, includes p-type dopants for a n-type transistor or includes n-type dopants for a p-type transistor. In some cases, the device well may be part of the epitaxial layer of substrate. For example, a first polarity type doped epitaxial layer may serve as the device well. Other configurations of device wells may also be useful.

In one embodiment, deep trench isolation (DTI) structures are provided in the substrate. In one embodiment, the DTI structures are provided for isolating or separating the different regions of the substrate. For example, DTI structures $160_{1-3}$ are provided to isolate the first device region 110 from the second device region 120 and to isolate the HV device regions from other regions in the substrate. A first DTI structure $160_1$, for example, is provided to isolate the first device region from the second device region while second and third DTI structures $160_2$ and $160_3$ isolates the first and second device regions from other device regions. The first DTI structure $160_1$, for example, isolates the LDPMOS transistor from the LDNMOS transistor in the HV device regions, while the second and third DTI structures $160_2$ and $160_3$ isolates the HV device regions from other device regions such as MV and/or LV device regions.

In one embodiment, a DTI structure extends from the top surface of the epitaxial layer 106 and into a portion of the first polarity type base substrate 101. The bottom of the DTI structure, for example, is below a top surface of the first polarity type base substrate 101. The DTI structure is filled with a fill material 167 and a dielectric layer 165 lining sidewalls of the DTI structure. The dielectric layer surrounds the fill material in the DTI structure. In one embodiment, the dielectric layer partially surrounds the fill material. For example, the dielectric layer surrounds a portion of the fill material from the top surface of the substrate. For example, the depth of the dielectric layer from the top surface of the substrate is less than the depth of the fill material. For example, the depth of the dielectric layer from the top surface of the substrate is $D_1$ while the depth of the fill material from the top surface of the substrate is $D_2$, where $D_2 > D_1$. Other configurations of the dielectric layer and fill material may also be useful. In other embodiments, the fill material and dielectric layer surrounding the fill material may have the same depth.

In one embodiment, the dielectric layer lining sidewalls of the DTI structure is an oxide layer while the fill material is a conductive material. For example, the dielectric layer lining sidewalls of the DTI structure includes a TEOS layer while the conductive material includes a polysilicon material. For example, the dielectric layer lining sidewalls of the DTI structure includes silicon oxide while the conductive material includes highly doped p-type polysilicon. Providing other materials for the fill material and dielectric layer may also be useful. For example, the fill material may be tungsten or copper. The DTI structures provide lateral isolation to the device regions. Additionally, the DTI structures may serve as a base substrate tap for biasing the base substrate.

In one embodiment, a top portion of the dielectric layer in the DTI structure fuses with an overlaying thermal dielectric layer 170, providing a thick top corner dielectric 175 of the DTI structure. The thermal dielectric layer disposed on the DTI structure, in one embodiment, is a thermally grown dielectric layer formed by a local oxidation of the substrate. For example, the thermal dielectric layer disposed on the DTI structure may be silicon oxide.

Metal silicide contacts may be provided on terminals or contact regions of the LDMOS transistors in the HV device region and transistors in other device regions (not shown). For example, metal silicide contacts may be provided on the gate electrode, S/D regions and well contacts. The silicide contacts, for example, may be nickel-based silicide contacts. Other suitable types of metal silicide contacts may also be useful. For example, the metal silicide contact may be cobalt silicide (CoSi). The silicide contacts may be employed to reduce contact resistance and facilitate contact to the back-end-of-line metal interconnects.

A dielectric layer 180 is disposed on the substrate covering the transistors and top surface of the substrate. The dielectric layer covers the thermal dielectric layer which overlaps the DTI structure in the substrate. The dielectric layer, in one embodiment, serves as a pre-metal dielectric (PMD) layer. The dielectric layer, for example, is a silicon oxide layer. In one embodiment, the dielectric layer is a high aspect ratio process (HARP) dielectric material or a dielectric layer formed of a low pressure process. Other suitable types of dielectric materials are also useful. For example, the dielectric layer may be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG).

The PMD layer includes via contacts or contact plugs coupled to the DTI structures and contact regions of the transistors (not shown). For example, contacts plugs are provided in the PMD layer to contact the gate electrode, S/D regions and well contacts (not shown). The contact plugs, for example, may be tungsten contact plugs. Other suitable types of conductive contact plugs may also be useful. In some embodiments, a DTI structure may serve as a through silicon via (TSV) contact.

An inter-metal dielectric (IMD) layer (not shown) may be provided over the PMD layer. The IMD layer, for example, may be silicon oxide. Other types of IMD dielectric materials may also be useful. An etch stop layer may be provided between the IMD and PMD layers. The IMD layer may include conductive lines disposed in the IMD layer which interconnect to the contact plugs. Other configurations of IMD and PMD layers may also be useful.

Figure 2B:
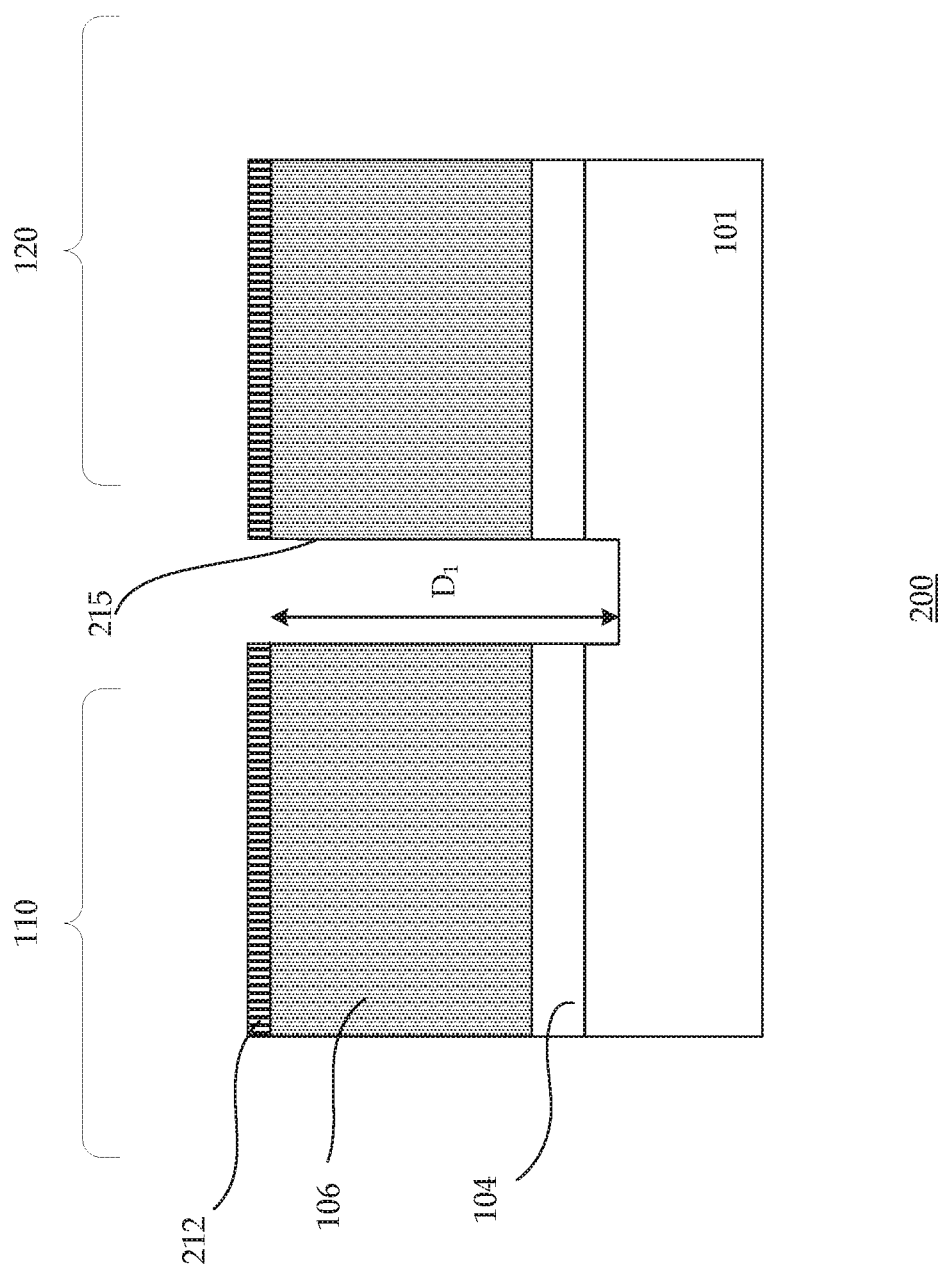

FIGS. 2a-2j show cross-sectional views of an embodiment of a process 200 for forming a device. The device, for example, is similar to the device 100 as described in FIG. 1. As such, common elements may not be described or described in detail. Referring to FIG. 2a, a substrate is provided. In one embodiment, the substrate includes a base substrate 101. The base substrate, in one embodiment, is a silicon substrate. The base substrate may be a doped substrate, such as a lightly doped p-type substrate. Other suitable types of semiconductor substrate may also be useful. The base substrate may be doped with other types of dopants or dopant concentrations, including undoped substrate.

In one embodiment, the substrate includes different device regions defined thereon. As illustrated, the substrate includes first and second device regions 110 and 120. For illustration purpose, the first and second device regions may be HV device regions. The device regions, for example, serve as device regions for high voltage transistors. For example, the first device region accommodates a LDPMOS transistor while the second device region accommodates a LDNMOS transistor. Other suitable types of high voltage transistors may also be useful. It should be understood that the substrate may include various types of device regions. For example, the substrate may include other device regions for other types of circuitries or devices. Depending on the type of IC formed, the other device regions, for example, may include regions for different voltage devices and for other types of devices. For example, the other device regions may include MV regions for MV devices and LV regions for LV devices and array regions. Other suitable types of device regions may also be provided.

A buried layer 104 may be formed in a top portion of the base substrate 101. For example, an ion implantation process which includes a blanket second polarity type ion implantation is performed to form a substantially continuous second polarity type buried layer 104 in the top portion of base substrate. The buried layer, for example, is a heavily doped region with second polarity type dopants for a first polarity type base substrate. For example, the buried layer is a n-type buried layer for a p-type base substrate. Alternatively, the buried layer is a p-type buried layer for a n-type base substrate.

An epitaxial layer 106 is provided over the buried layer. For example, the process continues with growing the epitaxial layer 106 over the buried layer. The base substrate, the buried layer and the epitaxial layer may be referred to as the substrate of the device. The top surface of the epitaxial layer may be referred to as a top surface of the substrate. The epitaxial layer, in one embodiment, is a second polarity type epitaxial layer. For example, the epitaxial layer is a n-type epitaxial layer grown on the n-type buried layer or a p-type epitaxial layer grown on a p-type buried layer. In an alternate embodiment, the epitaxial layer is a first polarity type epitaxial layer, such as p-type epitaxial layer grown on the n-type buried layer or a n-type epitaxial layer grown on a p-type buried layer. The dopant concentration of the epitaxial layer may be higher than the dopant concentration of the substrate.

In one embodiment, the process continues to form one or more DTI structures in the substrate. In one embodiment, the depth of the DTI structure may be defined by a two-step etch process. A hard mask 212 is formed on the top surface of the substrate as shown in FIG. 2b. The hard mask may be a hard mask stack which includes a pad oxide layer and a pad nitride layer. The pad oxide may be formed by thermal oxidation while the pad nitride may be formed by chemical vapor deposition (CVD). The pad nitride or upper layer of the mask stack serves as the mask while the pad oxide promotes adhesion of the upper layer to the substrate. Other suitable types of hard mask or forming techniques may also be useful.

The hard mask is used to pattern the substrate. In one embodiment, the hard mask is used to etch the epitaxial layer, buried layer and base substrate to form one or more deep isolation trenches for forming one or more DTI structures. Patterning the hard mask may be achieved by using a photoresist mask (not shown). For example, a photoresist is patterned by exposing it with an exposure source using a reticle with the desired pattern. After exposure, the photoresist is developed, transferring the pattern of the reticle to the photoresist.

A first etch is performed on the substrate. The etch, in one embodiment, is an anisotropic etch, such as a reactive ion etch (RIE), using the patterned photoresist as an etch mask. The etch forms a via opening for a deep isolation trench. The etch removes exposed portions of the hard mask, epitaxial layer, buried layer and the underlying base substrate. As illustrated in FIG. 2b, a first trench 215 having a first depth $D_1$ is formed in the substrate. In one embodiment, the first trench extends from the top surface of the substrate through the epitaxial and buried layers and into a portion of the base substrate. Alternatively, the soft mask layer transfers the pattern to the hard mask by etching the hard mask anisotropically. Then, using the hard mask as an etch mask, the via opening for the first trench is formed in the substrate.

After forming the first trench, the photoresist is removed by, for example, ashing. Other suitable techniques may also be used to remove the soft mask. The patterned hard mask 212 remains after the removal of the soft mask.

Figure 2C:
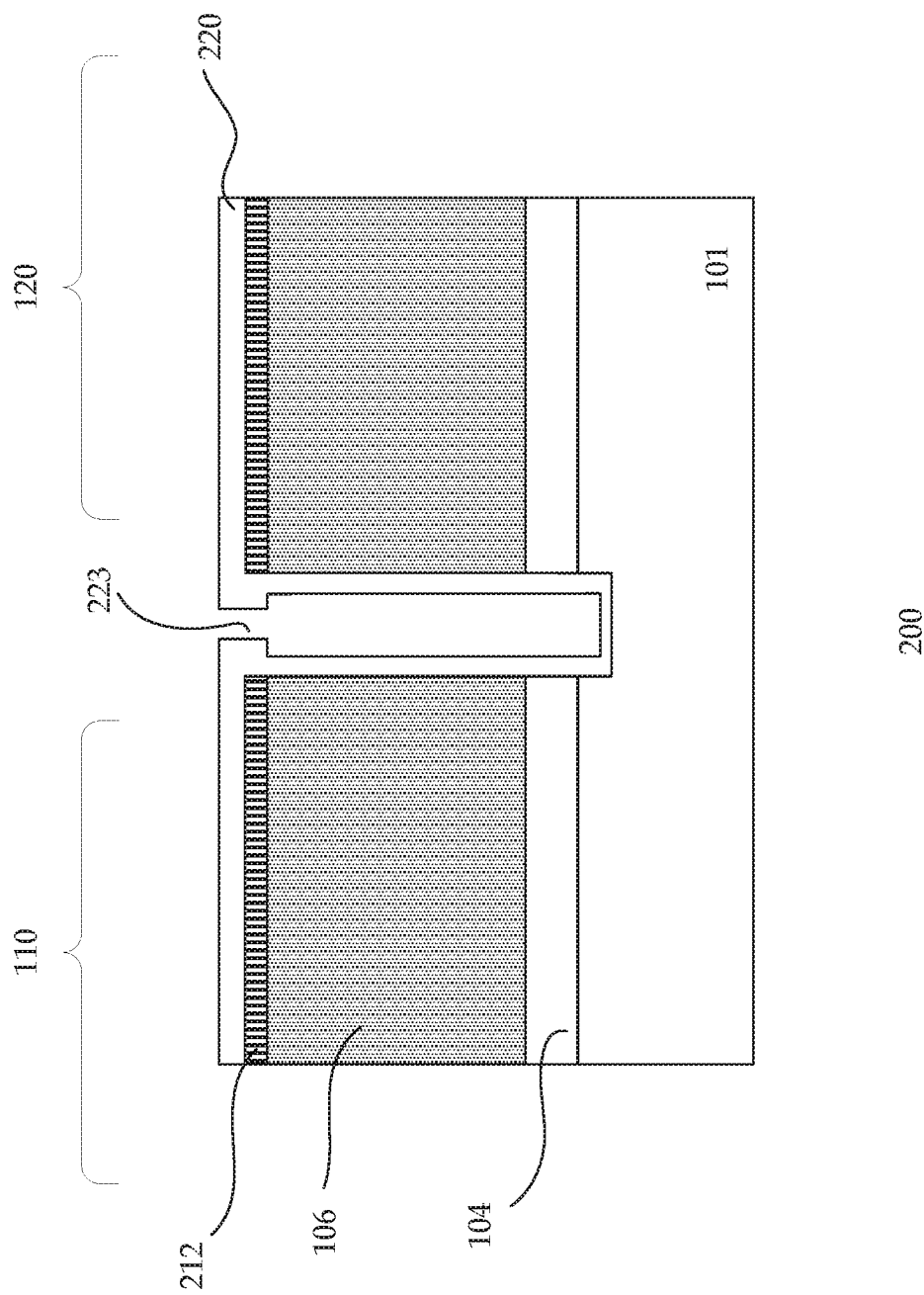

As shown in FIG. 2c, a dielectric layer 220 is deposited on the substrate. In one embodiment, the dielectric layer 220 lines sidewalls and top of the patterned hard mask and sidewalls and bottom of the first trench. As illustrated, deposition of the dielectric layer may result in a pinching effect to the deposited dielectric layer at a top portion 223 of the first trench. The dielectric layer may be formed by chemical vapor deposition (CVD). The dielectric layer may also be formed using other techniques. The dielectric layer, in one embodiment, may be an oxide layer. The dielectric layer, for example, may be a TEOS layer. Other suitable types of dielectric material may also be useful. The thickness, for example, should be sufficient to sustain the highest voltage between the buried layer and the DTI structure. For example, the buried layer is connected to $V_{DD}$ while the DTI is connected to first polarity type substrate and $V_{SS}$.

A second etch is performed. The second etch may be an etch back process. The etch back process removes horizontal portions of the dielectric layer on the surface of the substrate, the portion of the dielectric layer lining the hard mask and the portion of the dielectric layer lining the bottom of the first trench. The etch back process leaves portions of the dielectric layer lining the sidewalls of the first trench. For example, the etch back process forms a second trench 225 through the dielectric layer in the first trench. In one embodiment, etch back process forms a top portion of the dielectric layer with a slanted profile 227, as illustrated in FIG. 2d. For example, a top portion of the second trench has a slanted profile as defined by the dielectric layer.

In one embodiment, the etch back process removes a portion of substrate material to form a depth $D_2$ of the second trench from the top surface of the substrate. For example, $D_2$ has a deeper depth than $D_1$. For example, the second etch etches through the dielectric layer at the bottom of the first trench and a portion of the substrate to extend a depth of the trench. For example, the etch back process etches through the dielectric layer lining the bottom of the first trench with enough margin such that a depth of the first trench is extended to form the second trench. Other suitable depth dimensions for the second trench may also be useful. In other embodiments, the second trench may have the same depth as the first trench. Other suitable etch processes for the second etch may also be useful.

The process then removes the patterned hard mask. In one embodiment, the pad nitride layer is removed by, for example, a wet etch selective to the pad oxide layer and materials of the DTI structure. Other suitable techniques of removing the hard mask may also be useful. A stripping process may be performed to remove the remaining pad oxide layer to expose the top surface of the substrate. The pad oxide layer, for example, may be removed by a wet etch process, such as HF. Other suitable techniques may be employed for the stripping process.

A fill material 230 is deposited on the substrate to fill the deep isolation trench. For example, the fill material fills the second trench. The fill material, for example, may be a conductive material. The conductive material, for example, may be a polysilicon layer. The polysilicon layer, for example, may be highly doped with first polarity type dopants. For example, the polysilicon layer may be a highly p-doped polysilicon layer. The conductive material may be formed by, for example, CVD. Other suitable materials and techniques may be used for forming the conductive material. For example, the fill material may be copper. Excess fill material may be removed by a chemical mechanical polishing (CMP) process such that a top surface of the DTI structure formed is substantially coplanar with the top surface of the substrate as shown in FIG. 2e.

The process continues with increasing a thickness of the top corner of the dielectric layer in the DTI structure. In one embodiment, a local oxidation of the substrate (LOCOS) is performed. The LOCOS process includes performing selective oxidation in a region of the substrate which overlaps the DTI structure. The LOCOS process, in one embodiment, forms a thermal dielectric layer which overlaps the DTI structure. The thermal dielectric layer, in one embodiment, is a thermally grown oxide layer. For example, thermal dielectric layer is a silicon oxide layer grown on the substrate by thermal oxidation.

Selective oxidation in the region of the substrate which overlaps the DTI structure may be performed using a masking technique. In one embodiment, a hard mask 242 is deposited on the top surface of the substrate. The hard mask may be a hard mask stack which includes a pad oxide layer and a pad nitride layer. The pad oxide and the pad nitride may be formed by CVD. The pad nitride or upper layer of the mask stack serves as the mask while the pad oxide relieves tension in the substrate during growth of the isolation structure. Other suitable types of hard mask or forming techniques may also be useful.

Figure 2F:
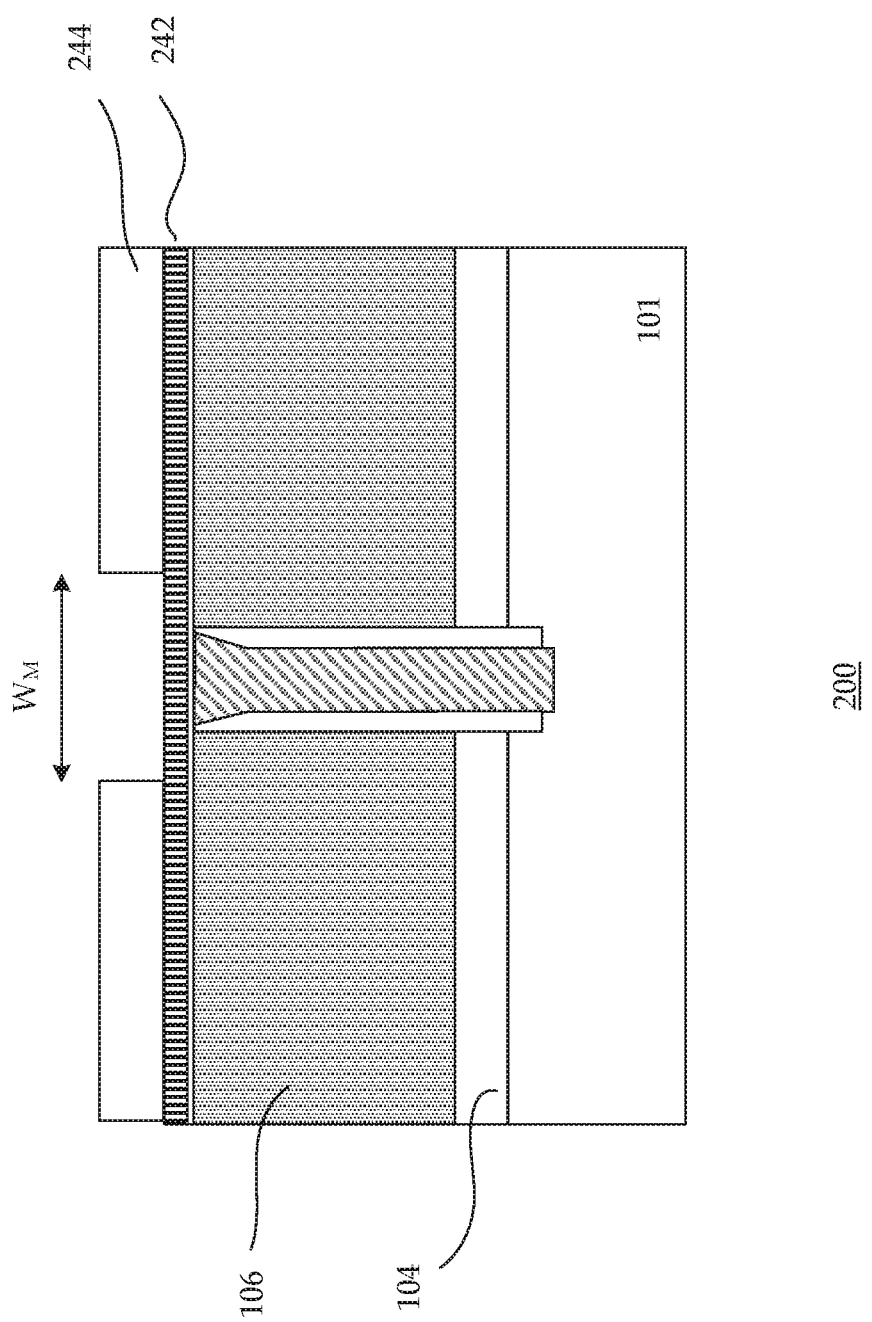
Figure 28:
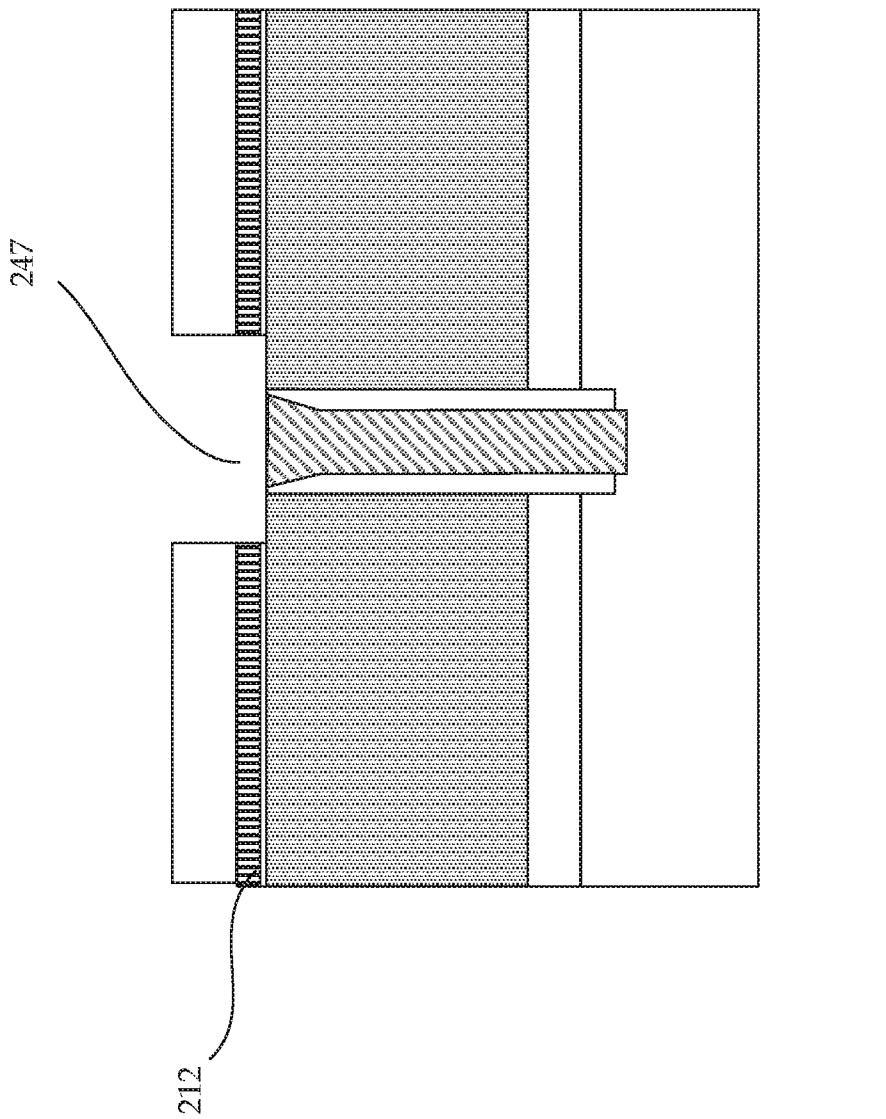

A LOCOS mask 244 is formed over the hard mask. For example, a photoresist layer is deposited over the hard mask and patterned by exposing it with an exposure source using a reticle with a pattern at a region above the DTI structure in the substrate. The photoresist layer, may be a thick photoresist layer. For example, the photoresist layer may have a thickness sufficient to pattern the hard mask. After exposure, the photoresist is developed, transferring the pattern of the reticle to the photoresist. The patterned photoresist, in one embodiment, has an opening exposing the hard mask in a region which corresponds to a DTI structure, as illustrated in FIG. 2f. For example, the opening overlaps the DTI structure with a width $W_M$ of about 1.5 um.

The hard mask layer is then etched using the patterned photoresist. The etch, in one embodiment, is an anisotropic etch, such as a reactive ion etch (ME), using the patterned photoresist as an etch mask. The pattern in the photoresist is transferred to the hard mask layer, forming an opening 247 in the hard mask layer. For example, the etch removes exposed portions of the nitride and oxide layers. As shown in FIG. 2g, a region at the top surface of the substrate is exposed. A top surface of the DTI structure in the substrate is exposed.

After patterning the hard mask, the photoresist is removed by, for example, ashing. Other suitable techniques may also be used to remove the photoresist. The patterned hard mask layer remains after the removal of the photoresist.

Figure 2H:
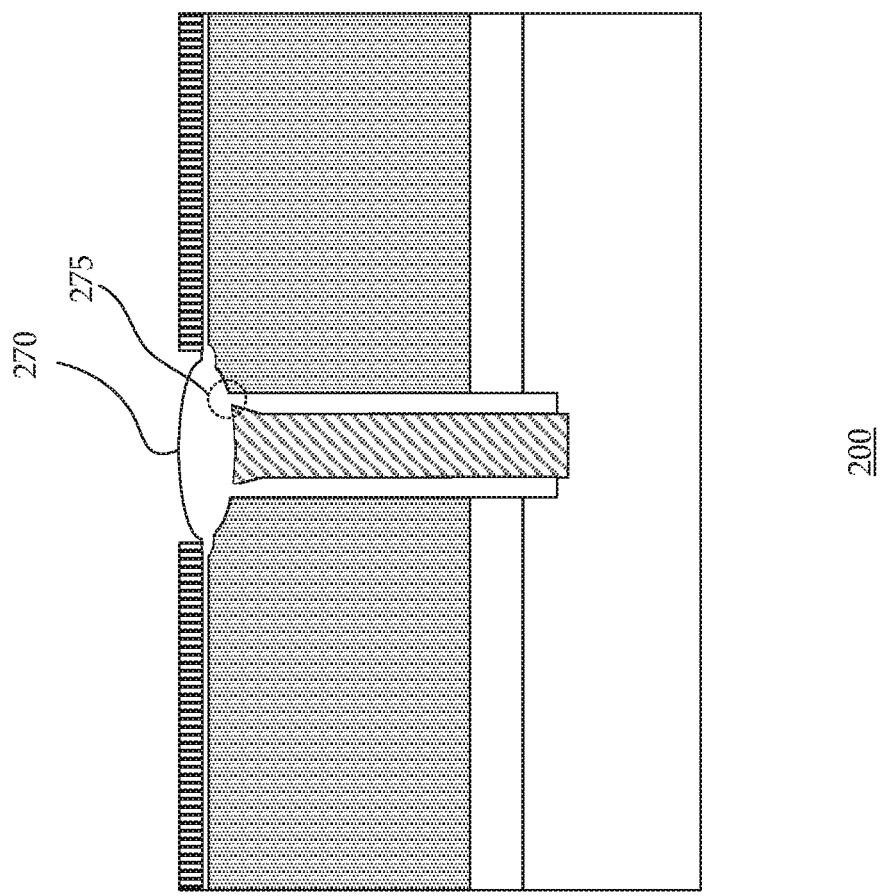

The LOCOS process continues with a thermal oxidation of the exposed region of the substrate with the exposed DTI structure. For example, a selective thermal oxidation is performed on the top surface of the substrate using the patterned hard mask. FIG. 2h shows a dielectric layer 270 thermally grown on the exposed region of the substrate, overlapping the DTI structure. The thermal oxidation process results in consumption of the substrate which forms an immersed thermal dielectric layer at a portion of the substrate on the DTI structure. As illustrated, the top corner of the dielectric layer in the DTI structure fuses with the thermal dielectric layer, forming a thick top corner dielectric of the DTI structure 275. For example, the LOCOS process increases the thickness of the top corner of the dielectric layer lining the sidewalls of the DTI structure.

Figure 2I:
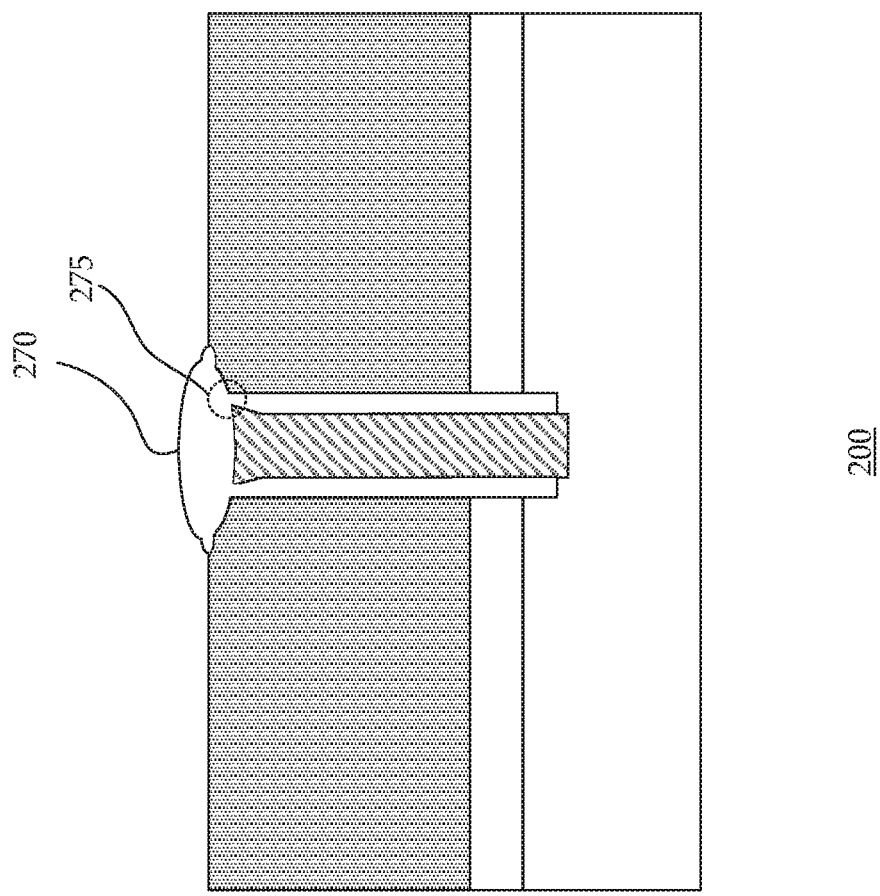

The process then removes the patterned hard mask as shown in FIG. 2i. In one embodiment, the pad nitride layer is removed by, for example, a wet etch selective to the pad oxide layer and materials of the DTI structures. Other suitable techniques of removing the hard mask may also be useful. A stripping process may be performed to remove the remaining pad oxide layer to expose the top surface of the substrate. The pad oxide layer, for example, may be removed by a wet etch process, such as HF. Other suitable techniques may be employed for the stripping process.

In some embodiments, the process continues to form isolation regions in the epitaxial layer, such as STI regions (not shown). Various processes can be employed to form the STI regions. For example, the substrate can be etched using mask and etch techniques to form isolation trenches which are then filled with dielectric materials such as silicon oxide. CMP can be performed to remove excess oxide and provide a planar substrate top surface. Other processes or materials can also be used to form the STI regions. Additionally, device or transistor wells and drift well may be defined in the first and/or second regions using suitable ion implantation techniques. The device well serves as a body well for a transistor.

The process continues to form active components on the substrate such as HV transistors. For example, the process continues to form various elements of the HV transistors. For illustration purpose, the process continues to complete formation of HV transistors, such as first and second LDMOS transistors. It is understood that other suitable number and types of transistors may be formed. The process to form the LDMOS transistors, for example, includes forming gates, sidewall spacers adjacent to the gate sidewalls and source/drain regions of the HV transistors. Various suitable techniques to form elements of the LDMOS transistors may be employed and will not be described in detail.

Figure 2J:
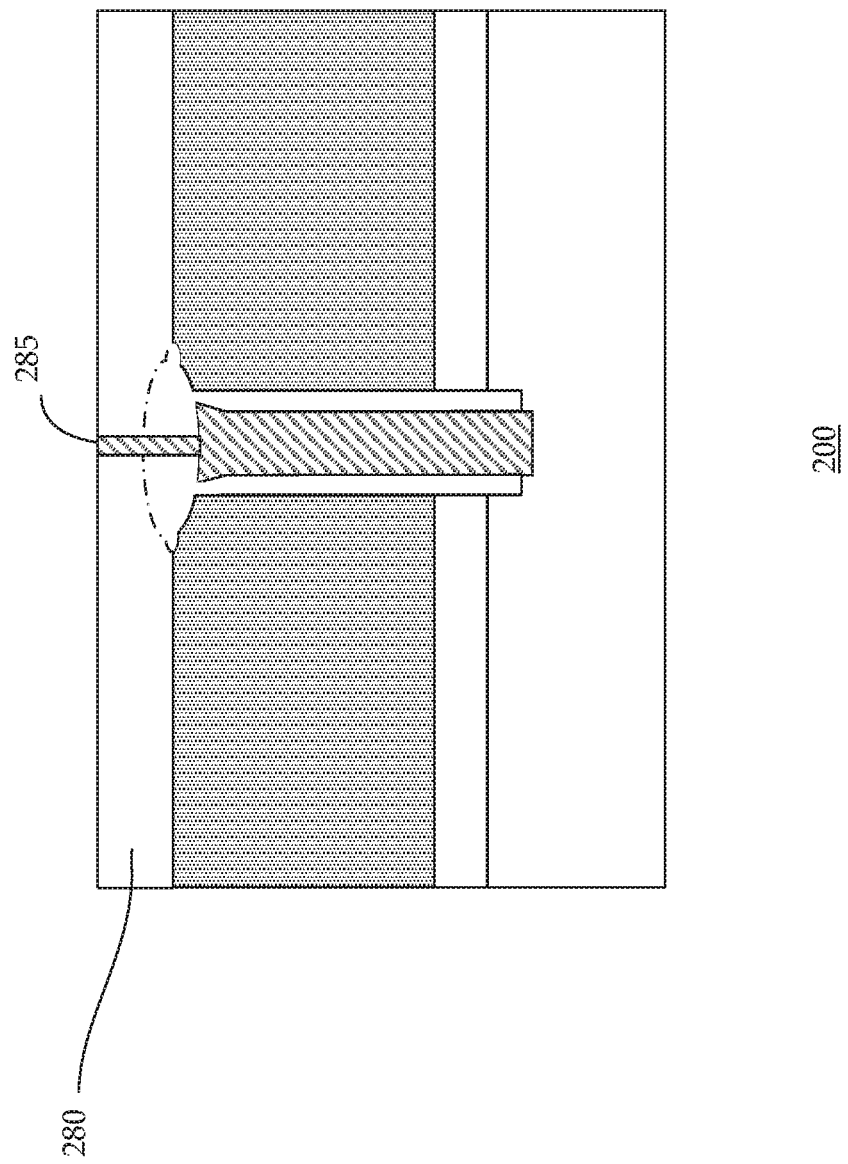

The process may continue to form metal silicide contacts on exposed substrate regions. A dielectric layer 280 is then deposited over the substrate, covering the transistors and top surface of the substrate as shown in FIG. 2j. The dielectric layer covers the thermally grown dielectric layer on the surface of the substrate. The dielectric layer 280, for example, serves as a PMD layer on the substrate. Contact plugs may be formed in the PMD layer. The contacts plugs, for example, are coupled to the DTI structure and contact regions of the LDMOS transistors (not shown). A DTI structure, for example, may serve as a through silicon via TSV contact. The process continues to complete forming the device. For example, additional processes may be performed to complete the device. Such processes may include forming other transistors in other device regions and additional interconnect metal levels, final passivation, dicing, packaging and testing.

The embodiments as described in FIG. 1 and FIGS. 2a-2j result in advantages. The DTI structure with thicker top corner dielectric decreases potential reliability risk present in conventional DTI structures with thin dielectric at the top corner profile. The DTI structure as described enhances the breakdown voltage margin and effectively isolates different device regions. Additionally, the process as described in FIGS. 2a-2j allows more process margin for forming the dielectric in the DTI structure and etch back process of the DTI sidewall.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for forming a device isolation structure in a semiconductor substrate, comprising:
   providing a substrate having a top surface, a bottom surface, a first device region, and a second device region;
   forming a trench between the first device region and the second device region that extends from the top surface of the substrate to a portion of the substrate;
   forming a first dielectric layer on the top surface of the substrate, a plurality of sidewalls of the trench, and a bottom of the trench;
   etching the first dielectric layer with an etch back process to remove the first dielectric layer from the bottom of the trench and the top surface of the substrate, wherein the etch back process modifies a top portion of the first dielectric layer on the plurality of sidewalls of the trench to form a slanted profile;

filling the trench with a fill material, wherein the first dielectric layer in the trench surrounds the fill material to define a deep trench isolation structure; and performing local thermal oxidation of the substrate over the deep trench isolation structure to form a second dielectric layer over the deep trench isolation structure that defines a thick top corner dielectric in the deep trench isolation structure.

2. The method of claim 1 wherein the fill material is a conductive material.

3. The method of claim 1 wherein the fill material is polysilicon.

4. The method of claim 1 wherein the etch back process extends the bottom of the trench into the portion of the substrate after removing the first dielectric layer from the bottom of the trench.

5. The method of claim 4 wherein the fill material extends deeper into the substrate than the first dielectric layer.

\* \* \* \* \*